United States Patent
Rofougaran

(10) Patent No.: US 8,447,260 B2
(45) Date of Patent: May 21, 2013

(54) METHOD AND SYSTEM FOR ON-DEMAND RECEIVER SUPPLY VOLTAGE AND CURRENT

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 1030 days.

(21) Appl. No.: 11/955,027

(22) Filed: Dec. 12, 2007

(65) Prior Publication Data

US 2009/0156147 A1 Jun. 18, 2009

(51) Int. Cl.
*H04B 17/00* (2006.01)
*H04B 1/16* (2006.01)
*H04B 1/38* (2006.01)

(52) U.S. Cl.
USPC ............... 455/343.1; 455/226.2; 455/343.2; 455/572

(58) Field of Classification Search
USPC .......... 455/67.11, 67.13, 226.1–226.4, 232.1, 455/234.1–234.2, 251.1, 343.1–343.2, 572
See application file for complete search history.

(56) References Cited

U.S. PATENT DOCUMENTS

| | | | | |
|---|---|---|---|---|
| 4,634,956 A | * | 1/1987 | Davis et al. | 323/222 |
| 5,280,643 A | * | 1/1994 | Ishii | 455/254 |
| 5,420,536 A | | 5/1995 | Faulkner | |
| 5,606,739 A | * | 2/1997 | Goto | 455/343.3 |
| 5,606,740 A | * | 2/1997 | Niratsuka et al. | 340/7.32 |
| 5,657,026 A | * | 8/1997 | Culpepper et al. | 342/374 |
| 5,826,170 A | * | 10/1998 | Hirschfield et al. | 455/13.4 |
| 5,940,749 A | * | 8/1999 | Cho et al. | 455/249.1 |
| 5,999,830 A | * | 12/1999 | Taniguchi et al. | 455/574 |
| 6,078,628 A | | 6/2000 | Griffith | |
| 6,223,025 B1 | * | 4/2001 | Tsukuda | 340/7.37 |
| 6,263,192 B1 | * | 7/2001 | Alderton | 455/73 |
| 6,356,745 B1 | * | 3/2002 | Lee et al. | 455/232.1 |
| 6,374,097 B1 | * | 4/2002 | Kudou | 455/232.1 |
| 6,374,127 B1 | * | 4/2002 | Park | 455/572 |
| 6,611,679 B1 | * | 8/2003 | Park et al. | 455/245.1 |
| 6,721,549 B2 | * | 4/2004 | Lee et al. | 455/234.1 |
| 6,794,858 B2 | * | 9/2004 | Ishii | 324/76.78 |
| 7,092,683 B2 | | 8/2006 | Tanaka | |
| 7,248,847 B2 | * | 7/2007 | Wallace et al. | 455/232.1 |
| 7,269,447 B2 | * | 9/2007 | Yamatani | 455/574 |
| 7,299,021 B2 | * | 11/2007 | P rssinen et al. | 455/226.1 |

(Continued)

OTHER PUBLICATIONS

Office Action of Jun. 21, 2010 for U.S. Appl. No. 11/876,037.

(Continued)

*Primary Examiner* — Simon Nguyen
(74) *Attorney, Agent, or Firm* — Farjami & Farjami LLP

(57) ABSTRACT

Aspects of a method and system for on-demand receiver supply voltage and current are provided. In this regard, strength of a signal received by one or more antennas may be measured and a voltage and/or current supplied to one or more of a LNA, a filter, a mixer and/or a data converter within said receiver may be varied based on the measured signal strength. The voltage and/or current may be varied based on signal strength of in-band and/or out-of-band signals. In this regard, the voltage and/or current may be increased when measured signal strength is above a threshold and decreased when the signal strength is below a threshold. The voltage and/or current may be controlled via a bias voltage determined based on the measurement. Similarly, the voltage and/or current may be controlled via a periodic signal with frequency and/or duty cycle determined based on the measurement.

18 Claims, 5 Drawing Sheets

U.S. PATENT DOCUMENTS

| | | | |
|---|---|---|---|
| 7,367,940 B2* | 5/2008 | Fujita et al. | 600/118 |
| 7,386,284 B2* | 6/2008 | Thompson | 455/115.3 |
| 7,440,738 B2* | 10/2008 | Zhang et al. | 455/234.1 |
| 7,457,598 B2* | 11/2008 | Zahm et al. | 455/245.1 |
| 7,522,885 B2* | 4/2009 | Parssinen et al. | 455/67.11 |
| 7,639,998 B1* | 12/2009 | Halvorson | 455/251.1 |
| 7,660,566 B2* | 2/2010 | Kuo et al. | 455/150.1 |
| 7,664,211 B2* | 2/2010 | Solum | 375/345 |
| 7,668,523 B2* | 2/2010 | Adams et al. | 455/245.2 |
| RE41,304 E* | 5/2010 | Matsuo et al. | 323/266 |
| 7,957,488 B2* | 6/2011 | Hiramoto | 375/316 |
| 2003/0045243 A1* | 3/2003 | Rauhala | 455/67.3 |
| 2004/0017847 A1 | 1/2004 | Alberth | |
| 2004/0152429 A1* | 8/2004 | Haub et al. | 455/102 |
| 2007/0264962 A1* | 11/2007 | Ueno et al. | 455/343.2 |
| 2008/0285684 A1* | 11/2008 | Shen et al. | 375/324 |
| 2009/0034642 A1 | 2/2009 | Rofougaran | |
| 2009/0036072 A1 | 2/2009 | Rofougaran | |

OTHER PUBLICATIONS

Final Office Action of Oct. 27, 2010 for U.S. Appl. No. 11/876,037.
Office Action of Apr. 26, 2010 for U.S. Appl. No. 11/864,861.
Final Office Action of Sep. 10, 2010 for U.S. Appl. No. 11/864,861.

* cited by examiner

METHOD AND SYSTEM FOR ON-DEMAND RECEIVER SUPPLY VOLTAGE AND CURRENT

CROSS-REFERENCE TO RELATED APPLICATIONS/INCORPORATION BY REFERENCE

Not Applicable

FIELD OF THE INVENTION

Certain embodiments of the invention relate to signal processing. More specifically, certain embodiments of the invention relate to a method and system for on-demand receiver supply voltage and current.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for on-demand receiver supply voltage and current, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for on-demand receiver supply voltage and current. In accordance with various exemplary embodiments of the invention, strength of a signal received by one or more antennas may be measured and a voltage and/or current supplied to one or more of a LNA, a filter, a mixer and/or a data converter within said receiver may be varied based on the measured signal strength. In various embodiments of the invention, exemplary characteristics comprising dynamic range may be determined via said measurement. Prior to measuring the signals strength, the received signal may be amplified and/or filtered. The voltage and/or current may be varied based on signal strength of in-band and/or out-of-band signals. In this regard, the voltage and/or current may be increased when measured signal strength is above a threshold and decreased when the signal strength is below a threshold. The voltage and/or current may be controlled via a bias voltage determined based on the measurement. Similarly, the voltage and/or current may be controlled via a periodic signal with frequency and/or duty cycle determined based on the measurement. Additionally, the signal measurement(s) may be utilized to control gain of the LNA.

Figure 1A:
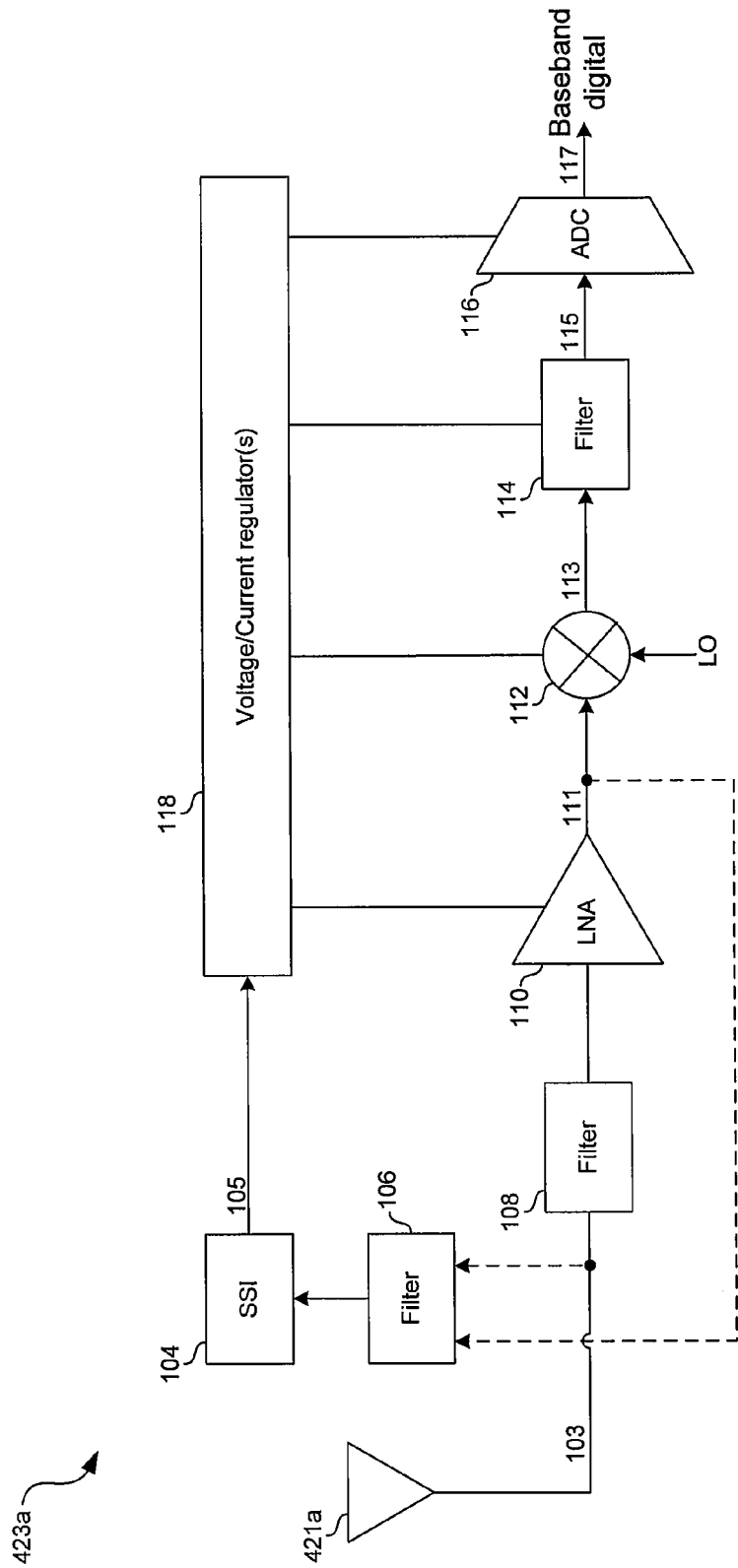
FIG. 1A is a block diagram of an exemplary receiver with on-demand supply voltage and/or current, in accordance with an embodiment of the invention.

FIG. 1A is a block diagram of an exemplary receiver with on-demand voltage and/or current supply, in accordance with an embodiment of the invention. Referring to FIG. 1A the receiver 423*a* may be comprise a signal strength indicator (SSI) 104, filters 106, 108, and 114, low noise amplifier (LNA) 110, mixer 112, analog-to-digital converter (ADC) 116, and regulator(s) 118.

The SSI 104 may comprise suitable logic, circuitry, and/or code that may enable determining signal strength. In this regard, the SSI 104 may, for example, be enabled to measure current, voltage and/or power of the signal 103 and/or 111. Additionally, the SSI 104 may be enabled to generate one or more control signals 105, which may be coupled to the regulator(s) 118. In various embodiments of the invention, the signal 105 may be a digital and/or analog signal representation of the current, voltage and/or power of the signal 103 and/or 111.

The filter 106 may comprise suitable logic, circuitry, and/or code for attenuating undesired frequencies to a greater extent than desired frequencies. In this regard, the filter 106 may have, for example, a bandpass frequency response. The filter 108 may be tunable such that a bandwidth and/or center frequency characterizing the frequency response of the filter may be adjustable. In this manner, the filter 106 may be controlled such that the SSI 104 may perform measurements of desired frequencies, bandwidths, etc.

The filter 108 may comprise suitable logic, circuitry, and/or code for attenuating undesired frequencies to a greater extent than desired frequencies. In this regard, the filter 106 may have, for example, a bandpass frequency response. The filter 108 may be tunable such that a bandwidth and/or center frequency characterizing the frequency response of the filter may be adjustable. In this manner, the filter 108 may enable tuning the receiver 423a to a desired frequency (e.g. 60 GHz).

The filter 114 may comprise suitable logic, circuitry, and/or code for attenuating undesired frequencies to a greater extent than desired frequencies. In this regard, the filter 114 may have, for example, a bandpass frequency response. The filter 114 may be tunable such that a bandwidth and/or center frequency characterizing the frequency response of the filter may be adjustable. In this manner, the filter 114 may be enabled to reject undesired inter-modulation products output by the mixer 112 while passing desired inter-modulation products.

The mixer 112 may comprise suitable logic, circuitry, and/or code that may enable generation of inter-modulation products resulting from the mixing of a received RF signal and a local oscillator (LO). The frequency of the LO signal may be determined based on the desired frequency/channel to be received. In this regard, the mixer 112 may enable down-converting, for example, RF signals of a range of frequencies to a fixed intermediate frequency (IF) or directly to baseband. In various embodiments of the invention, a voltage/current regulator(s) 118 supplying the mixer 112 may be modified based on one or more characteristic of received signals (e.g., strength of the desired frequency and/or out-of-band frequencies). In this manner, linearity requirements and/or efficiency of the system may be improved.

The LNA 110 may comprise suitable logic, circuitry, and/or code that may enable buffering and/or amplification of received RF signals. In this regard, the gain of the LNA 110 may be adjustable to enable reception of signals of varying strength. Accordingly, the output 111 of the LNA 110 may be measured (e.g., by the SSI 104) and the gain of the LNA 110 may be adjusted to maintain the signal 111 within determined limits.

The voltage/current regulator(s) 118 may comprise suitable logic circuitry, and/or code for supplying power to the LNA 110. In this regard, the voltage/current regulator(s) 118 may enable altering a voltage and/or current supplied (sourcing or sinking current) based on, for example, received (in-band and/or out-of-band) signal strength. In one embodiment of the invention, the output voltage and/or current of the voltage/current regulator(s) 118 may, for example, scale linearly with received in-band signal strength.

The ADC 116 may comprise suitable logic, circuitry, and/or code that may enable conversion of analog signals to a digital representation. In this regard, the ADC 116 may, for example, sample and quantize analog signal 115 at times specified by a sample clock. Accordingly, the ADC 116 may receive one or more control signals from, for example, a processor and/or a clock generator.

In operation, an RF signal received by the antenna 421a and/or the LNA output 111 may be measured to determine signal strength of in-band and/or out-of-band signals. In this regard, in-band may refer to signals within a passband of the filter 108 while out-of-band signals may fall in a stopband of the filter 108. The filter 106 may be adjusted and/or tuned and measurements may be taken at various frequencies and/or bandwidths in order to determine the in-band and/or out-of-band signal strengths. Alternatively, the SSI 104 may be enabled to determine other characteristics (e.g., signal to noise ratio, dynamic range, etc.) of the received signal by, for example, performing a fast Fourier transform analysis of the signal 103 and/or 111.

Signal strength measurements may be utilized to control voltage and/or current supplied by the regulator(s) 118 to the LNA 110, the mixer 112, the filters 114 (and possibly 106 ad 108), and the ADC 116. In this manner, efficiency of the receiver 423a may be improved. For example, for low signal strength the supply voltage to the LNA 110, the mixer 112, the filters 114 (and possibly 106 ad 108), and the ADC 116 may be reduced.

Figure 1B:
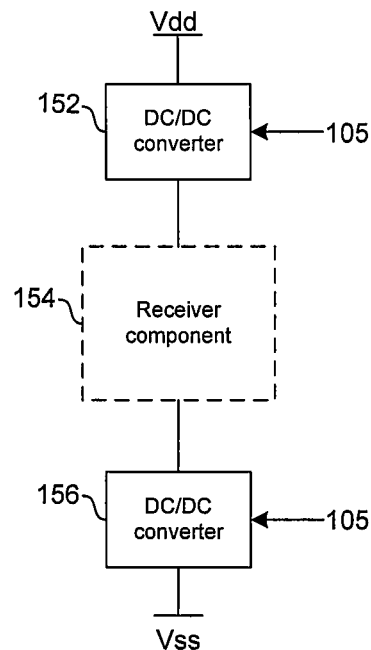
FIG. 1B is a block diagram of an exemplary receiver block supplied by controllable voltage sources, in accordance with an embodiment of the invention.

FIG. 1B is a block diagram of an exemplary receiver block supplied by controllable voltage sources, in accordance with an embodiment of the invention. Referring to FIG. 1B there is shown switching DC/DC converters 152 and 156, and receiver component 154.

The receiver component 154 may be similar to or the same as the LNA 110, the mixer 112, the filters 114 (and possibly 106 ad 108), or the ADC 116. In this regard, the receiver component 154 may be a generalized component for illustration purposes. For example, the component 154 may operate from a single (Vss=Gnd) or split (Vdd=−Vss) supply voltage.

The switching DC/DC converters 152 and 156 may each comprise suitable logic, circuitry, and/or code for converting a first DC voltage to one or more second DC voltages. In this regard, the output of the DC/DC converter 152 and 156 may depend on the first input voltage (e.g., Vdd or Vss) and a clock signal. In this regard, the signal 105 provided by the SSI 104 may be a clock signal and its phase, frequency, duty cycle, etc. may be determined, at least in part, based on the signal 105.

Figure 1C:
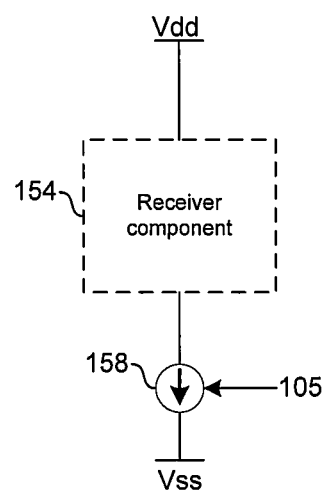
FIG. 1C is a block diagram of an exemplary receiver block supplied by a controllable current source, in accordance with an embodiment of the invention.

FIG. 1C is a block diagram of an exemplary receiver block supplied by a controllable current source, in accordance with an embodiment of the invention. Referring to FIG. 1B there is shown current source 158, and receiver component 154.

The receiver component 154 may be similar to or the same as the LNA 110, the mixer 112, the filters 114 (and possibly 106 ad 108), or the ADC 116. In this regard, the receiver component 154 may be a generalized component for illustration purposes. For example, the component 154 may operate from a single (Vss=Gnd) or split (Vdd=−Vss) supply voltage.

The current source 158 may comprise suitable logic, circuitry, and/or code for controlling the current supplied (source or sink) to the component 154. In an exemplary embodiment of the invention, the current source 158 may be one or more FETs and the current may be controlled via a bias voltage applied to the gate. In this regard, the signal 105 may be a DC voltage and its value may be determined, at least in part, by measured characteristics of the signal 103 and/or 111. In an exemplary embodiment of the invention, the current source may be one or more FETs and the current may be controlled via channel width of the FET. In this regard, the current source 158 may comprise a bank of FET(s) and the number of FETs coupled in parallel via one or more switching elements may control the effective channel width.

Figure 2:
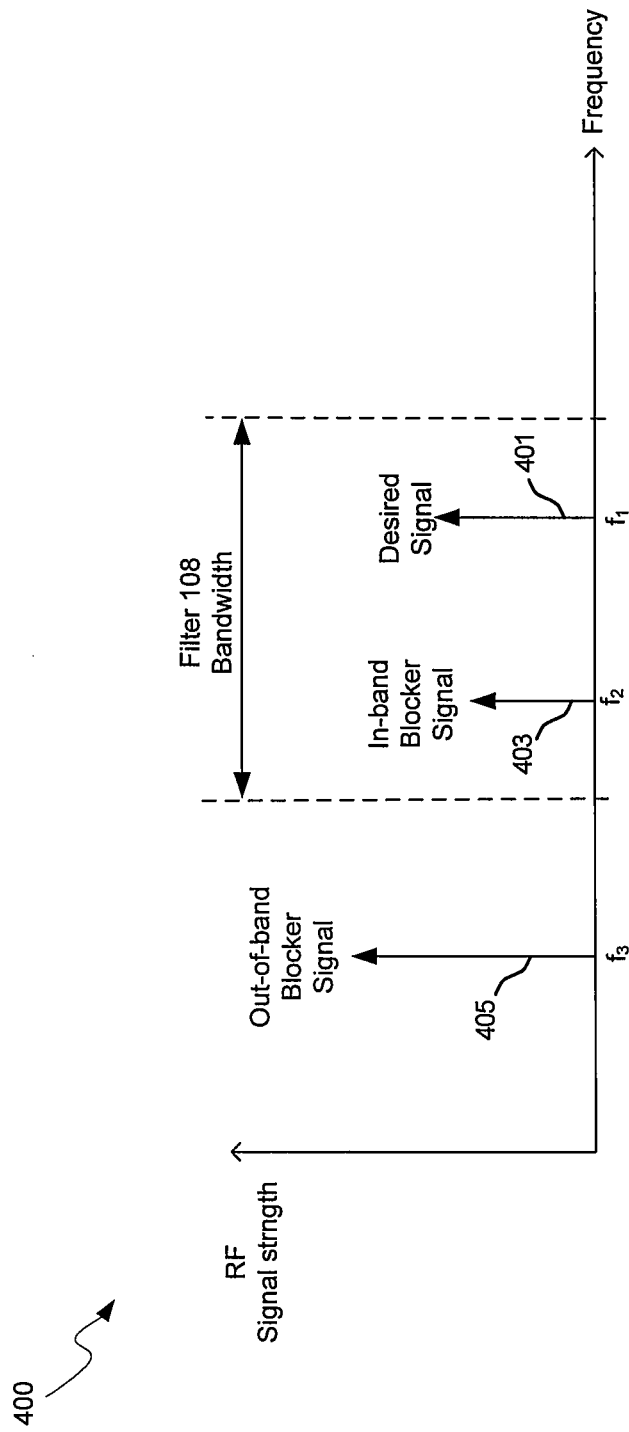
FIG. 2 is a diagram illustrating an exemplary frequency spectrum of signals arriving at a receiver with on-demand supply voltage and/or current, in accordance with an embodiment of the invention.

FIG. 2 is a diagram illustrating an exemplary frequency spectrum of signals arriving at a receiver with on-demand supply voltage and/or current, in accordance with an embodiment of the invention. Referring to FIG. 2, there is shown a desired signal 401, in-band blocker (interference) 403, and out-of-band blocker (interference) 405. Accordingly, the SSI 104 may be enabled to measure the strength of the signals 401, 403, and 405 and adjust the signal 105 accordingly. In an exemplary embodiment of the invention, the signal 401 may be a desired channel, the signal 405 may be an adjacent channel, and the signal 403 may be noise from, for example, a different technology or wireless standard.

Figure 3:
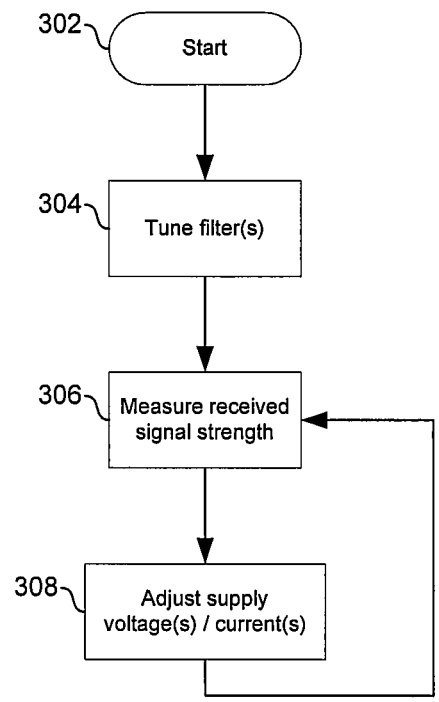
FIG. 3 is a flow chart illustrating exemplary steps for on-demand receiver supply voltage and/or current, in accordance with an embodiment of the invention.

FIG. 3 is a flow chart illustrating exemplary steps for on-demand receiver supply voltage and/or current, in accordance with an embodiment of the invention. Referring to FIG. 3 the exemplary steps may begin with start step 302 when signals are received by the antenna 421a. Subsequent to step 302, the exemplary steps may advance to step 304. In step 304, the filter 106, 108, and/or 114 may be tuned. In this regard, the filter 108 may be tuned to a desired channel for reception and processing by receiver 432a. In this manner, a passband of the filter 108 may be referred to herein as "in-band". Additionally, the filter 106 may be tuned to control which frequencies may be measured. For example, the filter 106 may sweep one or more frequency bands to characterize the environment in which the receiver 423a may be operating. Also, the filter 114 may be tuned to select a desired inter-modulation product from the mixer 112 and reject undesired inter-modulation products generated by the mixer 112. Subsequent to step 304, the exemplary steps may advance to step 306.

In step 306, the SSI 104 may provide a measure of the signal strength of the signal 103 and/or 111. Accordingly, the signal 105 generated by the SSI 104 may be based, at least in part, on the results of the measurement of the signal 103 and/or 111. For example, the signal 105 may be a DC voltage which controls one or more voltages and/or currents supplied by the regulator(s) 118. In another embodiment of the invention, the signal 105 may be a clock signal and a characteristic such as phase, frequency, duty cycle, etc. of the signal 105 may, at least in part, determine one or more voltages and/or currents supplied by the regulator(s) 118. Subsequent to step 306, the exemplary steps may advance to the step 308.

In step 308, a voltage and/or current supplied to the LNA 110, the mixer 112, the filter 114 (and possibly 106 and 108), and/or the ADC 116 may be adjusted via the signal 105. In this regard, adjusting supply voltages may improve the efficiency of the LNA 110, the mixer 112, the filter 114 (and possibly 106 and 108), and/or the ADC 116. Subsequent to step 308, the exemplary steps may return to step 306. In this regard, the process of monitoring the signal levels and adjusting the voltage/current may be based on periodic or continuous feedback. Accordingly, the voltage and/or current levels may be dynamically adjusted to improve efficiency of the system.

Figure 4:
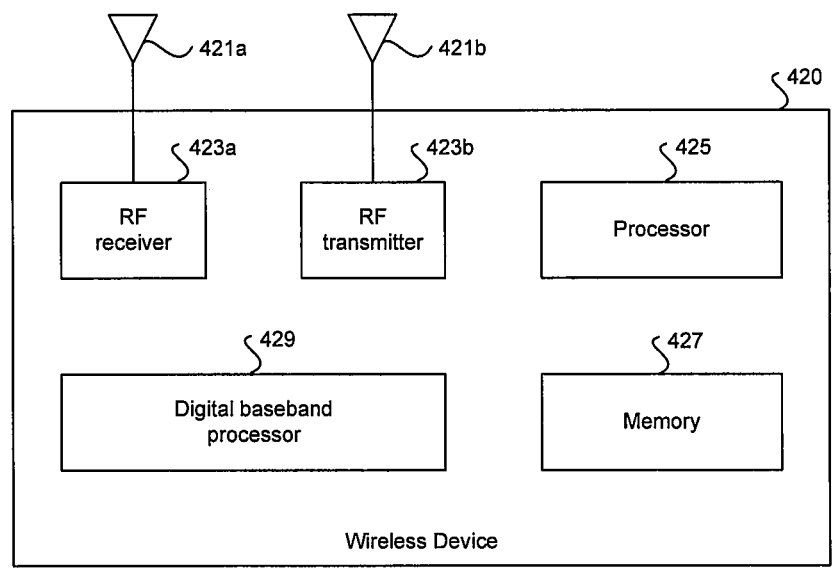
FIG. 4 is a block diagram illustrating an exemplary wireless device, in accordance with an embodiment of the invention.

FIG. 4 is a block diagram illustrating an exemplary wireless device, in accordance with an embodiment of the invention. Referring to FIG. 4, there is shown a wireless device 420 that may comprise an RF receiver 423a, an RF transmitter 423b, a digital baseband processor 429, a processor 425, and a memory 427. A receive antenna 421a may be communicatively coupled to the RF receiver 423a. A transmit antenna 421b may be communicatively coupled to the RF transmitter 423b. The wireless device 420 may be operated in a system, such as the cellular network and/or digital video broadcast network, for example.

The RF receiver 423a may comprise suitable logic, circuitry, and/or code that may enable processing of received RF signals. The RF receiver 423a may enable receiving RF signals in a plurality of frequency bands. For example, the RF receiver 423a may enable receiving signals in extremely high frequency (e.g., 60 GHz) bands. The receiver 423a may be as described with respect to FIG. 1A, for example. In this regard, the receiver 423a may be enabled to receive, filter, amplify, down-convert, and/or perform analog to digital conversion. Moreover, voltage and/or current supplied to one or more components of the receiver 423a may be dynamically adjusted, and thus power efficiency of the receiver 423a may be improved over conventional receivers. In various embodiments of the invention, the wireless device 420 may comprise a plurality of the receivers 423a and may thus support multiple frequency bands and or simultaneous reception of signals in the same frequency band.

The RF receiver 423a may down convert a received RF signal. Fore example, the RF receiver 423a may perform direct down conversion of the received RF signal to a baseband or may convert the received RF signal to an intermediate frequency (IF). In various embodiments of the invention, the receiver 423a may perform quadrature down-conversion where in-phase components and quadrature phase components may be processed in parallel.

The digital baseband processor 429 may comprise suitable logic, circuitry, and/or code that may enable processing and/or handling of baseband signals. In this regard, the digital baseband processor 429 may process or handle signals received from the RF receiver 423a and/or signals to be transferred to the RF transmitter 423b, when the RF transmitter 423b is present, for transmission to the network. The digital baseband processor 429 may also provide control and/or feedback information to the RF receiver 423a and to the RF transmitter 423b based on information from the processed signals. In this regard, the baseband processor 429 may provide a control signal to one or more of SSI 104, the LNA 110, the mixer 112, the filter 114 (and possibly 106 and 108), the regulator(s) 118, and/or the ADC 116. The digital baseband processor 429 may communicate information and/or data from the processed signals to the processor 425 and/or to the memory 427. Moreover, the digital baseband processor 429 may receive information from the processor 425 and/or to the memory 427, which may be processed and transferred to the RF transmitter 423b for transmission to the network.

The RF transmitter 423b may comprise suitable logic, circuitry, and/or code that may enable processing of RF signals for transmission. The RF transmitter 423b may enable transmission of RF signals in a plurality of frequency bands. For example, the RF transmitter 423b may enable transmitting signals in cellular frequency bands. Each frequency band supported by the RF transmitter 423b may have a corresponding front-end circuit for handling amplification and up conversion operations, for example. In this regard, the RF transmitter 423b may be referred to as a multi-band transmitter when it supports more than one frequency band. In another embodiment of the invention, the wireless device 420 may comprise more than one RF transmitter 423b, wherein each of the RF transmitter 423b may be a single-band or a multi-band transmitter.

In various embodiments of the invention, the RF transmitter 423b may perform direct up conversion of the baseband signal to an RF signal. In some instances, the RF transmitter 423b may enable digital-to-analog conversion of the baseband signal components received from the digital baseband processor 429 before up conversion. In other instances, the RF transmitter 423b may receive baseband signal components in analog form.

The processor 425 may comprise suitable logic, circuitry, and/or code that may enable control and/or data processing operations for the wireless device 420. The processor 425 may be utilized to control at least a portion of the RF receiver 423a, the RF transmitter 423b, the digital baseband processor 429, and/or the memory 427. In this regard, the processor 425 may generate at least one signal for controlling operations within the wireless device 420. In this regard, the baseband processor 429 may provide a control signal to one or more of SSI 104, the LNA 110, the mixer 112, the filter 114 (and possibly 106 and 108), the regulator(s) 118, and/or the ADC 116. The processor 425 may also enable executing of applications that may be utilized by the wireless device 420. For example, the processor 425 may execute applications that may enable displaying and/or interacting with content received via cellular transmission signals in the wireless device 420.

The memory 427 may comprise suitable logic, circuitry, and/or code that may enable storage of data and/or other information utilized by the wireless device 420. For example, the memory 427 may be utilized for storing processed data generated by the digital baseband processor 429 and/or the processor 425. The memory 427 may also be utilized to store information, such as configuration information, that may be utilized to control the operation of at least one block in the wireless device 420. For example, the memory 427 may comprise information necessary to configure the RF receiver 423a to enable receiving signals at various signal levels and in the presence of varying amounts of interference. In this regard, the memory may store control and/or configuration information for one or more of the SSI 104, the LNA 110, the mixer 112, the filter 114 (and possibly 106 and 108), the regulator(s) 118, and/or the ADC 116.

Aspects of a method and system for on-demand receiver supply voltage and current are provided. In this regard, strength of a signal received by one or more antennas (signal 103 of FIG. 1A) may be measured and a voltage and/or current supplied (via one or more regulators 118) to one or more of a LNA (110 FIG. 1A), a filter (106, 108, 114 of FIG. 1A), a mixer (112 of FIG. 1A) and/or a data converter (116 of FIG. 1A) within said receiver may be varied based on the measured signal strength. In various embodiments, characteristics such as dynamic range may be determined via said measurement. Prior to measuring the signals strength, the received signal may be amplified (LNA 110) and/or filtered (filter 106). The voltage and/or current may be varied based on signal strength of in-band and/or out-of-band (as defined by filter 108) signals. The voltage and/or current may be increased when measured signal strength is above a threshold and decreased when the signal strength is below a threshold. The voltage and/or current may be controlled via a bias voltage (signal 105) determined based on the measurement. Similarly, the voltage and/or current may be controlled via a periodic signal (signal 105) with frequency and/or duty cycle determined based on the measurement. Additionally, the signal measurement(s) may be utilized to control gain of the LNA.

Another embodiment of the invention may provide a machine-readable storage, having stored thereon, a computer program having at least one code section executable by a machine, thereby causing the machine to perform the steps as described herein for on-demand receiver supply voltage and/or current.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing in a receiver coupled to one or more antennas, said method comprising:
   measuring a signal strength of a signal received by said one or more antennas, said measured signal strength comprising a signal strength of at least one out-of-band signal; and
   determining a frequency of a clock signal based on said measured signal strength;
   generating said clock signal input to a DC/DC converter of said receiver, wherein said DC/DC converter supplies a voltage and/or current to one or more of a LNA, a filter, a mixer and/or a data converter of said receiver, and wherein said voltage and/or current is varied based on said frequency of said clock signal.

2. The method according to claim 1, wherein said measured signal strength comprises a signal strength of at least one in-band signal.

3. The method according to claim 1, comprising amplifying said received signal prior to said measurement.

4. The method according to claim 1, comprising filtering said received signal prior to said measurement.

5. The method according to claim 1, comprising varying a bias voltage based on said measured signal strength and varying said voltage and/or current based at least in part on said bias voltage.

6. The method according to claim 1, comprising varying a duty cycle of said clock signal based on said measured signal strength.

7. The method according to claim 1, comprising:
   increasing said voltage and/or current when said measured signal strength is above a threshold; and
   decreasing said voltage and/or current when said measured signal strength is below a threshold.

8. The method according to claim 1, comprising controlling a gain of said low noise amplifier in said receiver based on said measured signal strength.

9. The method according to claim 1, wherein said measured signal strength comprises a dynamic range of at least one in-band signal and at least one out-of-band signal.

10. A system for signal processing, the system comprising:
    one or more circuits in a receiver coupled to one or more antennas, said one or more circuits comprising a DC/DC converter and one or more LNA, a filter, a mixer and/or a data converter, and said one or more circuits being operable to:
    measure a signal strength of a signal received by said one or more antennas, said measured signal strength comprising a signal strength of at least one out-of-band signal;
    determine a frequency of a clock signal based on said measured signal strength;

generate said clock signal input to said DC/DC converter of said receiver, wherein said DC/DC converter supplies a voltage and/or current to said one or more of said LNA, said filter, said mixer and/or said data converter of said receiver, and wherein said voltage and/or current is varied based on said frequency of said clock signal.

11. The system according to claim 10, wherein said measured signal strength comprises a signal strength of at least one in-band signal.

12. The system according to claim 10, wherein said received signal is amplified prior to said measurement.

13. The system according to claim 10, wherein said received signal is filtered prior to said measurement.

14. The system according to claim 10, wherein said one or more circuits are operable to vary a bias voltage based on said measured signal strength and vary said voltage and/or current based at least in part on said bias voltage.

15. The system according to claim 10, wherein said one or more circuits are operable to vary a duty cycle of said clock signal based on said measured signal strength.

16. The system according to claim 10, wherein said one or more circuits are operable to:
   increase said voltage and/or current when said measured signal strength is above a threshold; and
   decrease said voltage and/or current when said measured signal strength is below a threshold.

17. The system according to claim 10, wherein said one or more circuits control a gain of said low noise amplifier in said receiver based on said measured signal strength.

18. The system according to claim 10, wherein said measured signal strength comprises a dynamic range of at least one in-band signal and at least one out-of-band signal.

* * * * *